(12) United States Patent
Tu et al.

(10) Patent No.: US 8,362,496 B1
(45) Date of Patent: Jan. 29, 2013

(54) OPTICAL MODULE PACKAGE UNIT

(75) Inventors: Ming-Te Tu, Taichung (TW); Chao-Wei Yu, Taichung (TW)

(73) Assignee: Lingsen Precision Industries, Ltd., Taichung (TW)

( * ) Notice: Subject to any disclaimer, the term of this patent is extended or adjusted under 35 U.S.C. 154(b) by 0 days.

(21) Appl. No.: 13/288,648

(22) Filed: Nov. 3, 2011

(30) Foreign Application Priority Data

Sep. 27, 2011 (TW) .............................. 100218095 U

(51) Int. Cl.
*H01L 21/00* (2006.01)
(52) U.S. Cl. .............................. 257/82; 257/81; 257/80
(58) Field of Classification Search ............... 257/80, 257/81, 82
See application file for complete search history.

(56) References Cited

U.S. PATENT DOCUMENTS

| | | | | |
|---|---|---|---|---|
| 5,930,276 A * | 7/1999 | Dou et al. | ......................... | 372/34 |
| 6,476,469 B2 * | 11/2002 | Hung et al. | ..................... | 257/676 |
| 6,489,178 B2 * | 12/2002 | Coyle et al. | ..................... | 438/51 |
| 6,858,910 B2 * | 2/2005 | Coyle et al. | ..................... | 257/415 |
| 6,900,531 B2 * | 5/2005 | Foong et al. | ..................... | 257/687 |
| 6,953,891 B2 * | 10/2005 | Bolken et al. | ................. | 174/559 |
| 7,026,548 B2 * | 4/2006 | Bolken et al. | ................. | 174/538 |
| 7,026,654 B2 * | 4/2006 | Igaki et al. | ..................... | 257/80 |
| 7,233,025 B2 * | 6/2007 | Davuluri et al. | ................ | 257/81 |
| 7,423,335 B2 * | 9/2008 | Yang et al. | ..................... | 257/680 |
| 7,449,779 B2 * | 11/2008 | Honer et al. | ..................... | 257/737 |
| 7,675,073 B2 * | 3/2010 | Moyer et al. | ..................... | 257/81 |
| 7,751,054 B2 * | 7/2010 | Backes | .......................... | 356/445 |
| 7,816,697 B1 * | 10/2010 | Spurlock et al. | ................. | 257/98 |
| 7,858,445 B2 * | 12/2010 | Honer et al. | ................... | 438/113 |
| 8,110,837 B2 * | 2/2012 | Lai et al. | ........................... | 257/81 |
| 8,115,296 B2 * | 2/2012 | Bolken et al. | ................. | 257/692 |
| 2002/0060357 A1 * | 5/2002 | Hung et al. | ..................... | 257/676 |
| 2003/0045025 A1 * | 3/2003 | Coyle et al. | ..................... | 438/106 |
| 2003/0189213 A1 * | 10/2003 | Igaki et al. | ....................... | 257/81 |
| 2004/0080037 A1 * | 4/2004 | Foong et al. | .................... | 257/687 |
| 2005/0057883 A1 * | 3/2005 | Bolken et al. | ................. | 361/301.3 |
| 2005/0130342 A1 * | 6/2005 | Zheng et al. | ................... | 438/106 |
| 2005/0141828 A1 * | 6/2005 | Narayan et al. | ................... | 385/92 |
| 2005/0189622 A1 * | 9/2005 | Humpston et al. | ............ | 257/659 |
| 2005/0189635 A1 * | 9/2005 | Humpston et al. | ............ | 257/678 |
| 2005/0263312 A1 * | 12/2005 | Bolken et al. | ................. | 174/52.4 |
| 2006/0169490 A1 * | 8/2006 | Bolken et al. | ................. | 174/521 |
| 2006/0183625 A1 * | 8/2006 | Miyahara | ..................... | 501/98.4 |
| 2006/0220234 A1 * | 10/2006 | Honer et al. | ................... | 257/724 |
| 2006/0263003 A1 * | 11/2006 | Asai et al. | ........................ | 385/14 |
| 2008/0118199 A1 * | 5/2008 | Asai et al. | ........................ | 385/14 |
| 2008/0157250 A1 * | 7/2008 | Yang et al. | ..................... | 257/433 |
| 2008/0157252 A1 * | 7/2008 | Cheng et al. | .................... | 257/434 |
| 2008/0187762 A1 * | 8/2008 | Hayashi et al. | ............... | 428/413 |
| 2008/0296589 A1 * | 12/2008 | Speier et al. | .................... | 257/82 |
| 2009/0008729 A1 * | 1/2009 | Yang et al. | ..................... | 257/432 |
| 2009/0023249 A1 * | 1/2009 | Honer et al. | ................... | 438/113 |
| 2009/0027652 A1 * | 1/2009 | Chang et al. | ................. | 356/4.01 |

(Continued)

*Primary Examiner* — Laura Menz
(74) *Attorney, Agent, or Firm* — Muncy, Geissler, Olds & Lowe, PLLC

(57) ABSTRACT

An optical module package unit includes a light-emitting chip and a light sensor chip respectively installed in a light-emitting zone and a light-sensing zone on a substrate, a lid of plastic shell integrally formed on the substrate and defining therein a first cavity and a second cavity around the light-emitting chip and the light sensor chip respectively, and two packaging adhesive structures respectively molded in the first cavity and the second cavity to encapsulate the light-emitting chip and the light sensor chip respectively. As the light-emitting chip and the light sensor chip are integrally packaged on the substrate, the packaging cost of the optical module is significantly lowered.

8 Claims, 2 Drawing Sheets

U.S. PATENT DOCUMENTS

| | | | |
|---|---|---|---|
| 2009/0152581 A1* | 6/2009 | Kishimoto et al. | 257/98 |
| 2009/0256249 A1* | 10/2009 | Yu et al. | 257/686 |
| 2010/0044722 A1* | 2/2010 | Lai et al. | 257/80 |
| 2010/0055835 A1* | 3/2010 | Yu et al. | 438/107 |
| 2010/0055836 A1* | 3/2010 | Yu et al. | 438/107 |
| 2010/0181466 A1* | 7/2010 | Wang et al. | 250/216 |
| 2010/0181578 A1* | 7/2010 | Li et al. | 257/82 |
| 2010/0181589 A1* | 7/2010 | Huang et al. | 257/98 |
| 2010/0258828 A1* | 10/2010 | Ramer et al. | 257/98 |
| 2010/0264532 A1* | 10/2010 | Bolken et al. | 257/680 |
| 2011/0057129 A1* | 3/2011 | Yao et al. | 250/552 |
| 2011/0062478 A1* | 3/2011 | Negley | 257/98 |
| 2011/0127555 A1* | 6/2011 | Rains, Jr. et al. | 257/98 |
| 2011/0133941 A1* | 6/2011 | Yao et al. | 340/600 |
| 2011/0156074 A1* | 6/2011 | Liu et al. | 257/98 |
| 2011/0186975 A1* | 8/2011 | Chen | 257/676 |
| 2011/0193125 A1* | 8/2011 | Ushiro et al. | 257/98 |
| 2011/0221070 A1* | 9/2011 | Yen et al. | 257/774 |
| 2011/0254040 A1* | 10/2011 | Nagai | 257/98 |
| 2012/0009712 A1* | 1/2012 | Liu | 438/51 |
| 2012/0025211 A1* | 2/2012 | Yeh et al. | 257/82 |
| 2012/0025255 A1* | 2/2012 | Kishimoto et al. | 257/98 |
| 2012/0126386 A1* | 5/2012 | Bolken et al. | 257/680 |
| 2012/0132788 A1* | 5/2012 | Findlay | 250/208.2 |
| 2012/0153153 A1* | 6/2012 | Chang et al. | 250/338.1 |
| 2012/0228681 A1* | 9/2012 | Lin et al. | 257/290 |

* cited by examiner

OPTICAL MODULE PACKAGE UNIT

BACKGROUND OF THE INVENTION

1. Field of the Invention

The present invention relates to optical module packaging technology and more particularly, to an optical module package unit, which effectively lowers the optical module packaging cost.

2. Description of the Related Art

To avoid accidental touching of the touch screen or to save power consumption, a handheld electronic device (such as smart phone) is generally equipped with a proximity optical sensor module. When the handheld electronic device is in proximity to the surface of an object (for example, the face of a person), the proximity optical sensor module is induced to switch off a part of the power supply. The proximity optical sensor module uses a light-emitting chip to emit a light source, and a light sensor chip to receive the light that is emitted by the light-emitting chip and reflected by a media (for example, the face) and then to convert the light signal into an electronic signal for further processing.

The aforesaid conventional proximity optical sensor module is made by separately packaging the light-emitting chip and the light sensor chip into a respective individual package and then mounting the two individual packages together to form a module. As the light-emitting chip and the light sensor chip are separately packaged, the packaging cost of the proximity optical sensor module remains high.

Further, after packaging of the aforesaid conventional proximity optical sensor module, the light-emitting chip has a low luminous efficiency, and the mating light sensor chip may receive a poor light signal, resulting reading instability of the handheld electronic device. Therefore, there is a strong demand for improvement to eliminate the drawbacks of the aforesaid conventional proximity optical sensor module design.

SUMMARY OF THE INVENTION

The present invention has been accomplished under the circumstances in view. It is the main object of the present invention to provide an optical module package unit, which effectively lowers the packaging cost, enhancing product competitiveness.

It is another object of the present invention to provide an optical module package unit, which assures a high level of luminous efficiency of the light-emitting chip, effectively improving the drawback of poor light receiving performance of the light sensor chip.

To achieve these and other objects of the present invention, an optical module package unit comprises a substrate, a light-emitting chip, a light sensor chip, a lid and two packaging adhesive members. The substrate defines a light-emitting zone and a light-sensing zone. The light-emitting chip is installed in the light-emitting zone of the substrate. The light sensor chip is installed in the light-sensing zone of the substrate. The lid is a plastic shell mounted at the substrate, comprising a light-emitting hole and a light-sensing hole. The light-emitting hole comprises an annular reflective layer covered on the inside wall thereof that has an inner diameter increasing gradually in direction from the bottom side toward the top side thereof and forming a first cavity on the substrate around the light-emitting chip. The light-sensing hole is a stepped hole formed of a first hole portion and a second hole portion and disposed at one lateral side relative to the light-emitting hole. The first hole portion and the second hole portion are kept in communication with each other and have different diameters. The second hole portion forms a second cavity on the substrate around the light sensor chip. The two packaging adhesive structures are respectively molded in the first cavity and the second cavity on the substrate to encapsulate the light-emitting chip and the light sensor chip respectively, working as a protective layer for the light-emitting chip and a protective layer for the light sensor chip respectively.

Thus, the optical module package unit of the present invention enables the light-emitting chip and the light sensor chip be directly installed in one same substrate by means of die-attaching and wire-bonding and then integrally caped by the lid, and then enables the two packaging adhesive members be directly molded in the light-emitting hole and light-sensing hole to encapsulate the light-emitting chip and the light sensor chip respectively, effectively lowering the packaging cost of the optical module.

Further, the metal coating that is coated on the surface of the annular reflective layer of the light-emitting hole of the lid by sputtering deposition or any other suitable coating technique and the design of the dome-like top of the packaging adhesive member that encapsulates the light-emitting chip effectively enhance the luminous efficiency of the light-emitting chip.

Other advantages and features of the present invention will be fully understood by reference to the following specification in conjunction with the accompanying drawings, in which like reference signs denote like components of structure.

DETAILED DESCRIPTION OF THE INVENTION

Figure 1:
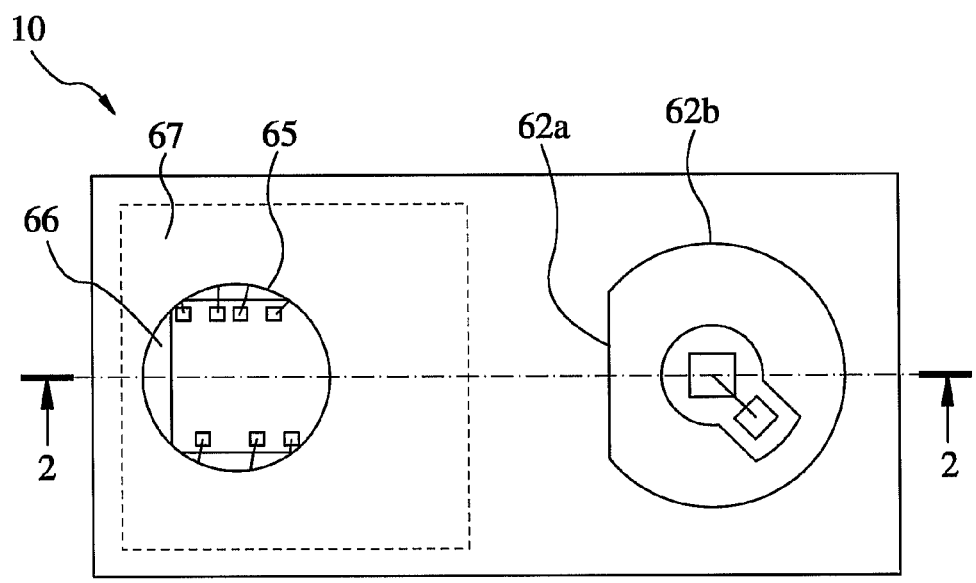
FIG. 1 is a schematic top view of an optical module package unit in accordance with the present invention.
Figure 2:
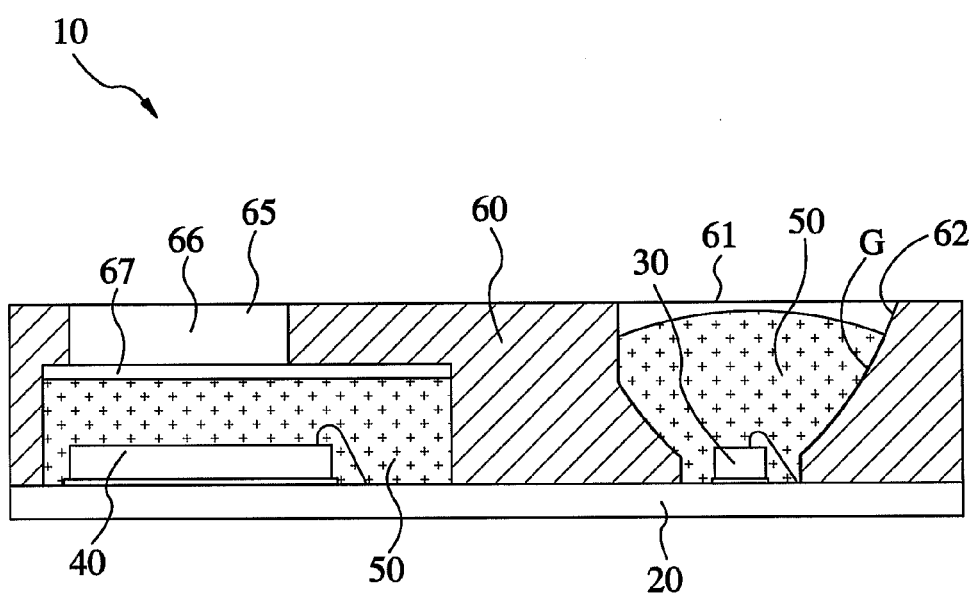
FIG. 2 is a sectional view taken along line 2-2 of FIG. 1.
Figure 3:
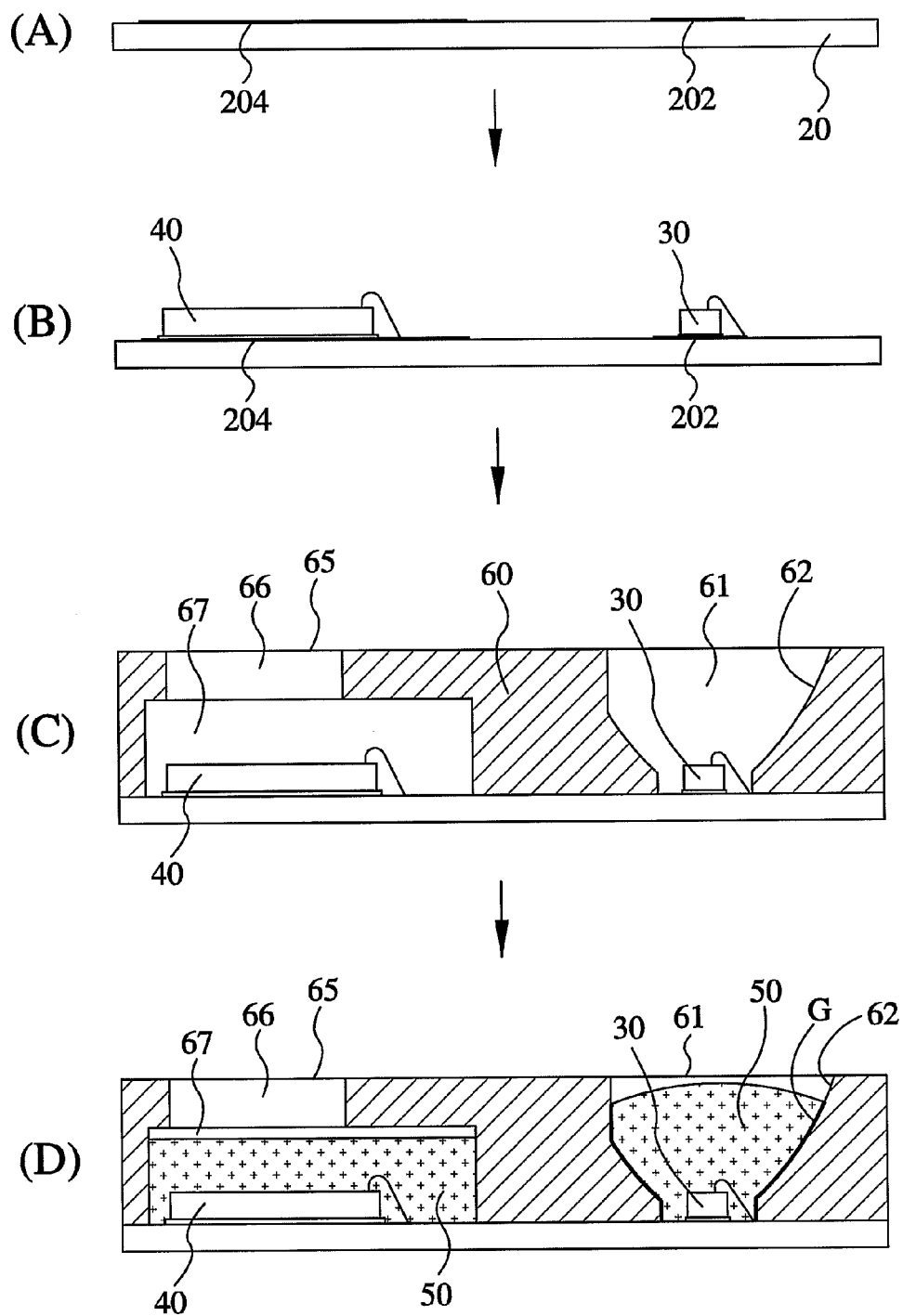
FIGS. 3A~3D illustrate the packaging flow of the optical module package unit in accordance with the present invention.

Referring to FIGS. 1~3, an optical package unit 10 is cut from an array package. The optical package unit 10 comprises a substrate 20, a light-emitting chip 30, a light sensor chip 40, two packaging adhesive members 50 and a lid 60.

The substrate 20 according to this embodiment is not a ceramic substrate. It can be prepared from organic BT (bismaleimide triazine) resin or FR4 glass epoxy for the advantages of low manufacturing cost and high mechanical values and electrical insulating qualities. The substrate 20 defines a light-emitting zone 202 and a light-sensing zone 204.

The light-emitting chip 30 and the light sensor chip 40 are respectively installed in the light-emitting zone 202 and light-sensing zone 204 of the substrate 20 by means of die-attaching and wire-bonding processes. The light-emitting chip 30 is adapted for emitting light. The light sensor chip 40 is adapted for sensing the light source emitted by the light-emitting chip 30.

The lid 60 is a thermoplastic shell or thermoset shell prepared from polypropylene (PP) or liquid crystal polyester (LCP) by injection or transfer molding and integrally formed on the substrate 20, comprising a light-emitting hole 61 and a light-sensing hole 65. The light-emitting hole 61 comprises an annular reflective layer 62 covered on the inside wall thereof that has an inner diameter increasing gradually in direction from its bottom side toward its top side. The annular reflective layer 62 has the edge of the top open side thereof formed of a straight segment 62a and a circular arc segment 62b. The annular reflective layer 62 is coated with a metal coating G by a coating technique, for example, sputtering deposition, enhancing the luminous efficiency of the light-emitting chip 30. The light-sensing hole 65 is a stepped hole formed of a first hole portion 66 and a second hole portion 67 and disposed at one lateral side relative to the light-emitting hole 61. The first hole portion 66 and the second hole portion 67 are kept in communication with each other, however, they are not equal in diameter, i.e., the diameter of the first hole portion 66 is relatively smaller than the second hole portion 67. According to this embodiment, the light-emitting hole 61 of the lid 60 and the second hole portion 67 of the light-sensing hole 65 of the lid 60 are respectively attached to the substrate 20 around the light-emitting chip 30 and the light sensor chip 40, thereby forming a first cavity and a second cavity.

The packaging adhesive structures 50 are prepared from, for example, transparent epoxy resin and molded in the light-emitting hole 61 of the lid 60 and the second hole portion 67 of the light-sensing hole 65 of the lid 60 to encapsulate the light-emitting chip 30 and the light sensor chip 40 for protection. The transparent adhesive that encapsulates the light-emitting chip 30 in the respective cavity has a dome-like top, enhancing the luminous efficiency of the light-emitting chip 30.

Referring to FIGS. 3A-3D, the optical module packaging flow is outlined hereinafter. The packaging of the optical module includes the steps of:

1) making a light-emitting zone 202 and a light-sensing zone 204 on each individual substrate 20 of every substrate array;
2) employing a die-attaching process and a wire-bonding process to install the light-emitting chip 30 and the light sensor chip 40 in the light-emitting zone 202 and the light-sensing zone 204;
3) bonding a lid array 60 to the chip-bonded substrate array; and
4) molding two transparent adhesive bodies 50 in the first cavity of the light-emitting hole 61 of the lid 60 in the light-emitting zone 202 of the substrate 20 and the second cavity of the second hole portion 67 of the light-sensing hole 65 of the lid 60 in the light-sensing zone 204 of the substrate 20 to encapsulate the light-emitting chip 30 and the light sensor chip 40 for protection.

After the aforesaid packaging procedure, a follow-up singulation process is formed. As this singulation process is of the known art, no further detailed description in this regard is necessary.

As described above, the optical module package unit uses an inexpensive substrate (non-ceramic substrate, such as BT substrate or FR4 substrate) 20 and an integrated plastic lid 60, the material cost is low. Further, unlike the prior art design to have a light-emitting chip and a light sensor chip be separately packaged, the invention lets the light-emitting chip 30 and the light sensor chip 40 be directly installed in the substrate 20 and packaged together, significantly lowering the manufacturing cost.

Further, the light source emitted by the light-emitting chip 30 will be reflected by the reflective layer 62 of the light-emitting hole 61 of the lid 60 onto the surface of the object in proximity, enabling the light to be reflected by the surface of the object in proximity onto the light sensor chip 60 through the light-sensing hole 65 of the lid 60. Upon receipt of the reflected light, the light sensor chip 60 converts the optical signal into a corresponding electronic signal for further computation. During the light emitting and receiving process, the design of the pattern of the opening of the reflective layer 62 of the light-emitting hole 61 of the lid 60 enables the light sensor chip 40 to effectively sense the reflected light from an uneven surface of an object in proximity (for example, the face of a person). Further, the design of the metal coating G of the reflective layer 62 and the design of the dome-like top of the transparent adhesive greatly enhance the luminous efficiency of the light-emitting chip 30.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An optical module package unit, comprising:
a substrate defining a light-emitting zone and a light-sensing zone;
a light-emitting chip installed in said light-emitting zone of said substrate;
a light sensor chip installed in said light-sensing zone of said substrate;
a lid being a plastic shell mounted at said substrate, said lid comprising a light-emitting hole and a light-sensing hole, said light-emitting hole comprising an annular reflective layer covered on an inside wall thereof that has an inner diameter increasing gradually in direction from a bottom side toward a top side thereof and forming a first cavity on said substrate around said light-emitting chip, said light-sensing hole being a stepped hole formed of a first hole portion and a second hole portion and disposed at one lateral side relative to said light-emitting hole, said first hole portion and said second hole portion being kept in communication with each other and having different diameters, said second hole portion forming a second cavity on said substrate around said light sensor chip; and
two packaging adhesive structures respectively molded in said first cavity and said second cavity on said substrate to encapsulate said light-emitting chip and said light sensor chip respectively.

2. The optical module package unit as claimed in claim 1, wherein said lid is integrally formed on said substrate in one of the forms of thermoplastic shell and thermoset shell.

3. The optical module package unit as claimed in claim 1, wherein said annular reflective layer of said lid is coated with a layer of metal coating.

4. The optical module package unit as claimed in claim 1, wherein the diameter of said first hole portion of said light-sensing hole of said lid is smaller than the diameter of said second hole portion.

5. The optical module package unit as claimed in claim 1, wherein the packaging adhesive member packaged in said first cavity to encapsulate said light-emitting chip has a dome-like top.

6. The optical module package unit as claimed in claim 1, wherein said substrate is a non-ceramic substrate prepared from organic BT (bismaleimide triazine) resin.

7. The optical module package unit as claimed in claim 1, wherein said lid is selected from the group of polypropylene (PP) or liquid crystal polyester (LCP).

8. The optical module package unit as claimed in claim 3, wherein said annular reflective layer of said lid comprises a top open side, said top open side having a peripheral edge formed of a straight segment and a circular arc segment.

* * * * *